(12) United States Patent
Asano

(10) Patent No.: US 7,362,786 B2
(45) Date of Patent: Apr. 22, 2008

(54) SEMICONDUCTOR LASER ELEMENT HAVING TENSILE-STRAINED QUANTUM-WELL ACTIVE LAYER

(75) Inventor: Hideki Asano, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 449 days.

(21) Appl. No.: 11/073,521

(22) Filed: Mar. 8, 2005

(65) Prior Publication Data

US 2005/0195875 A1  Sep. 8, 2005

(30) Foreign Application Priority Data

Mar. 8, 2004  (JP) .............................. 2004-063879

(51) Int. Cl.
*H01S 5/00* (2006.01)
(52) U.S. Cl. ................................. 372/45.011
(58) Field of Classification Search ............ 372/45.011
See application file for complete search history.

(56) References Cited

U.S. PATENT DOCUMENTS 6,396,863 B1 * 5/2002 Fukunaga ................ 372/46.01
6,744,797 B2 * 6/2004 Kuniyasu et al. ...... 372/45.011

FOREIGN PATENT DOCUMENTS

JP          6-275907 A       9/1994

* cited by examiner

*Primary Examiner*—Minsun Harvey
*Assistant Examiner*—Marcia A. Golub
(74) *Attorney, Agent, or Firm*—Sughrue Mion, PLLC

(57) ABSTRACT

In a semiconductor laser element, a lower cladding layer of AlGaInP of the first conductive type, a lower optical waveguide layer of AlGaInP, a quantum-well active layer of InGaP, an upper optical waveguide layer of AlGaInP, and an upper cladding layer of AlGaInP of the second conductive type are formed in this order on a substrate of GaAs of the first conductive type. The degree of mismatch $\Delta a/a$ with the substrate and the thickness dw of the quantum-well active layer satisfy the conditions, $-0.6\% \leq \Delta a/a \leq -0.3\%$ and $10 \text{ nm} \leq dw \leq 20 \text{ nm}$. In addition, the resonator length Lc and the reflectances Rf and Rr of the opposite end facets satisfy the conditions, $Lc \geq 400$ μm and $Rf \times Rr \geq 0.5$.

2 Claims, 3 Drawing Sheets

SEMICONDUCTOR LASER ELEMENT HAVING TENSILE-STRAINED QUANTUM-WELL ACTIVE LAYER

BACKGROUND OF THE INVENTION

1. Field of the Invention

The present invention relates to a semiconductor laser element which is suitable for use in optical communications.

2. Description of the Related Art

In recent years, extension of optical fibers to individual homes has been becoming more prevalent, and the individual homes have been more intellectually empowered through optical networks. Although the transmission rates of the optical-fiber communications are currently about 100 Mbps, demands for transmission of greater amount of information at higher transmission rates will increase in the future.

In the above circumstances, it is important to suppress the cost of placement of optical fibers. Therefore, attention is currently being focused on the plastic fibers rather than the quartz-based fibers, which are currently mainstream, since the plastic fibers are less expensive. In addition, since the plastic fibers have large core diameters and are easy to couple to semiconductor lasers, it is possible to suppress the construction cost.

However, the plastic fibers cause great internal loss. For example, Japanese Unexamined Patent Publication No. 6(1994)-275907 discloses a 660-nm band semiconductor laser in which an active layer has a compressed-strain quantum-well structure made of InGaP, and which is currently used as a light source for DVD recording. When this semiconductor laser is used as a light source for optical communication, internal loss of about 200 dB/km occurs in plastic fibers, and data can be transmitted at most to a distance of about 30 m.

The transmission distance can be increased by decreasing the wavelength of the transmitted light. For example, if the wavelength of the transmitted light can be decreased to 650 nm, it is possible to decrease the internal loss in the optical fiber to 150 dB/km, i.e., about ¾ of the internal loss in the case where the wavelength of the transmitted light is 660 nm. However, when the oscillation wavelengths of semiconductor lasers are decreased to 645 to 650 nm, the characteristics of the semiconductor lasers deteriorate due to various constraints. Therefore, the semiconductor lasers having an oscillation wavelength of 645 to 650 nm are not yet practicable.

For example, it is possible to consider decrease in the oscillation wavelength of the semiconductor laser disclosed in Japanese Unexamined Patent Publication No. 6(1994)-275907 to 645 nm by reducing the thickness of the quantum-well active layer. However, since it is impossible to obtain sufficient gain when the thickness of the quantum-well active layer is small, it is necessary to compensate for the insufficiency of the gain by increasing the number of quantum wells. The increase in the number of quantum wells increases the driving current. Therefore, it is impossible to secure sufficient reliability. In addition, in order to realize the oscillation wavelength of 645 nm, it is necessary to reduce the thickness of the quantum-well active layer to about 2 nm. Nevertheless, since, in such a case, the thickness of the quantum-well active layer is near to the atomic sizes, it is difficult to control the thickness, and resultantly the oscillation wavelengths of individual semiconductor laser elements can greatly vary.

Alternatively, the oscillation wavelengths of semiconductor lasers can be decreased by replacing the quantum-well active layer with an unstrained InGaP layer. However, in this case, it is impossible to obtain a satisfactory current-optical output characteristic since the effect of reducing the threshold value in the strained quantum-well structure is lost.

SUMMARY OF THE INVENTION

The present invention has been developed in view of the above circumstances.

The object of the present invention is to provide a semiconductor laser element which has an oscillation wavelength of 645 to 650 nm at the room temperature (about 25° C.) and exhibits satisfactory current-optical output and lifetime characteristics.

In order to accomplish the aforementioned object, the present invention is provided. According to the present invention, there is provided a semiconductor laser element comprising: a substrate made of GaAs of a first conductive type; a lower cladding layer formed above the substrate and made of AlGaInP of the first conductive type; a lower optical waveguide layer formed above the lower cladding layer and made of AlGaInP; a quantum-well active layer formed above the lower optical waveguide layer and made of InGaP; an upper optical waveguide layer formed above the quantum-well active layer and made of AlGaInP; and an upper cladding layer formed above the upper optical waveguide layer and made of AlGaInP of the second conductive type. In the above semiconductor laser element, the substrate has an intrinsic lattice constant a, and the quantum-well active layer has a thickness dw, an intrinsic lattice constant a+$\Delta$a, and a degree of mismatch $\Delta a/a$ with the substrate, and the degree of mismatch $\Delta a/a$ and the thickness dw satisfy the conditions, $-0.6\% \leq \Delta a/a \leq -0.3\%$ and $10 \text{ nm} \leq dw \leq 20 \text{ nm}$.

The degree of mismatch $\Delta a/a$ is positive when the quantum-well active layer has a compressive strain, and is negative when the quantum-well active layer has a tensile strain.

In addition, the semiconductor laser element has a resonator length Lc, a light-emission end facet exhibiting a first reflectance Rf, and an end facet being located opposite to the light-emission end facet and exhibiting a second reflectance Rr, and the resonator length Lc and the first and second reflectances Rf and Rr satisfy the conditions, $Lc \geq 400 \text{ }\mu m$ and $Rf \times Rr \geq 0.5$.

Preferably, the thickness dw, the degree of mismatch $\Delta a/a$, the resonator length Lc, and the first and second reflectances Rf and Rr are determined so that the oscillation wavelength of the semiconductor laser element is 645 to 650 nm at the ambient temperature of 25° C. when the optical output power of the semiconductor laser element is 1 mW.

Since the InGaP quantum-well active layer in the semiconductor laser element according to the present invention has a tensile strain, the semiconductor laser element benefits from the effect of the strain, which reduces the threshold value. In addition, the thickness of the InGaP quantum-well active layer is at least 10 nanometers, which is necessary for ensuring the reliability, is secured. Further, the mirror loss is suppressed by controlling the resonator length and the reflectances at the end facets. Therefore, the oscillation at the short wavelengths is realized without deterioration of the laser characteristics.

In particular, in the case where the oscillation wavelength $\lambda$ of the semiconductor laser element is 645 to 650 nm at the ambient temperature of 25° C. when the optical output power of the semiconductor laser element is 1 mW, and the semiconductor laser element is used as a light source for optical communication, it is possible to suppress the internal loss in the optical fiber, and reduce the cost of placement of fibers. Thus, the present invention can contribute to the development of the optical networks.

DESCRIPTION OF PREFERRED EMBODIMENTS

An embodiment of the present invention is explained in detail below with reference to drawings.

Figure 1:
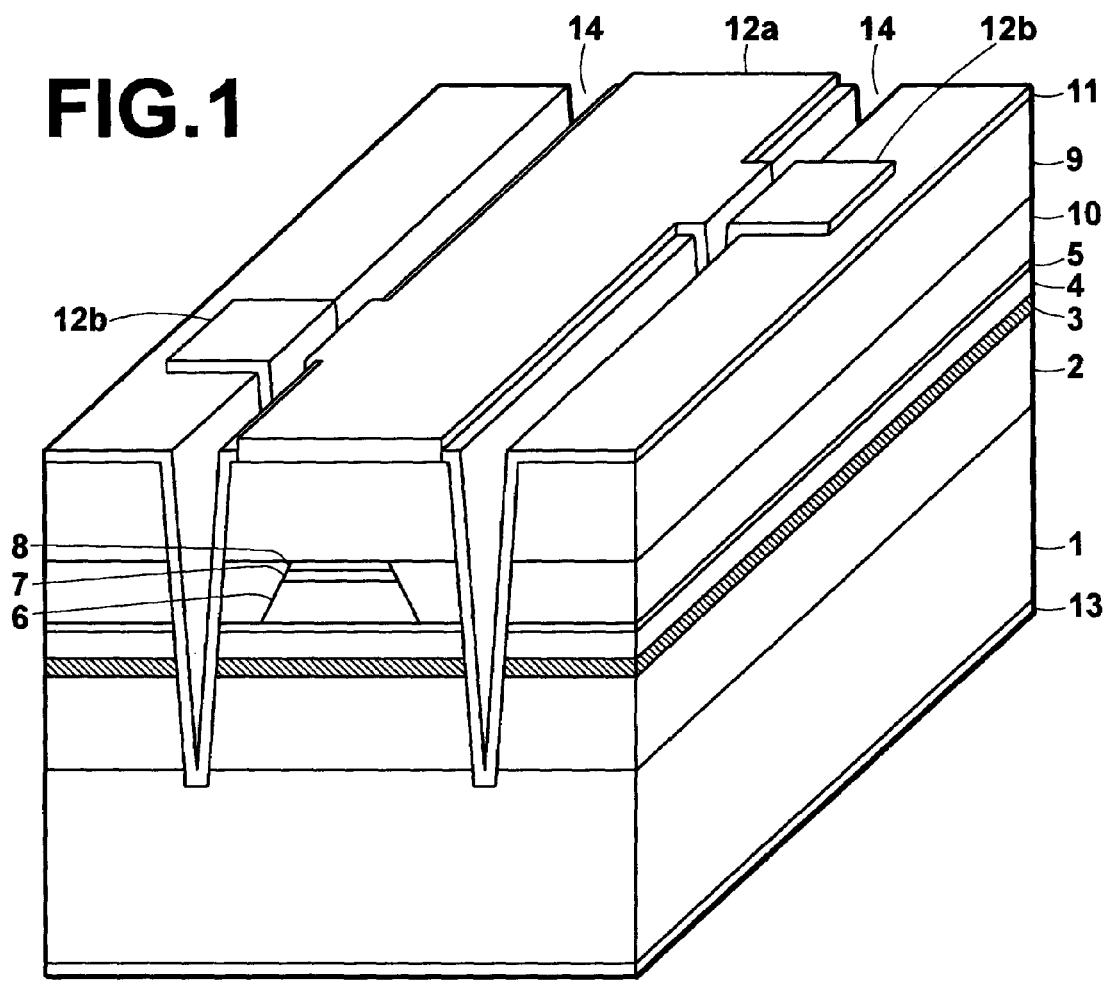
FIG. 1 is a schematic perspective view of a semiconductor laser element according to an embodiment of the present invention.

FIG. 1 is a schematic perspective view of the semiconductor laser element according to the embodiment of the present invention.

The semiconductor laser element according to the present embodiment is produced by forming a laser structure on an n-type GaAs substrate 1 having a principal plane the crystal orientation of which is tilted 15 degrees from (100) toward (011).

As illustrated in FIG. 1, the semiconductor laser element according to the present embodiment has a structure in which an n-type $(Al_xGa_{1-x})_{0.5}In_{0.5}P$ lower cladding layer 2 (x=0.7), a light-emission layer 3, a p-type $(Al_xGa_{1-x})_{0.5}In_{0.5}P$ first upper cladding layer 4 (x=0.7), and a p-type InGaP etching-stop layer 5 are formed in this order on the n-type GaAs substrate 1. It is preferable that the p-type InGaP etching-stop layer 5 is a tensile-strain InGaP layer so that the waveguide loss is reduced.

Further, a p-type AlGaInP second upper cladding layer 6, a p-type InGaP heterobarrier layer 7, and a p-type GaAs cap layer 8 are formed in this order on the p-type InGaP etching-stop layer 5. The widths of the p-type AlGaInP second upper cladding layer 6, the p-type InGaP heterobarrier layer 7, and the p-type GaAs cap layer 8 are smaller than the width of the n-type GaAs substrate 1 so that the p-type AlGaInP second upper cladding layer 6, the p-type InGaP heterobarrier layer 7, and the p-type GaAs cap layer 8 form a ridge. In addition, an n-type GaAs current-blocking layer 10 is formed on both sides of the above ridge, and a p-type GaAs contact layer 9 is formed so as to cover the ridge and the n-type GaAs current-blocking layer 10.

Furthermore, in order to reduce the parasitic capacitances at the pn junction interfaces of the n-type GaAs current-blocking layer 10, a pair of trenches 14 are formed on both sides of the ridge through the p-type GaAs contact layer 9, the n-type GaAs current-blocking layer 10, the p-type InGaP etching-stop layer 5, the p-type $(Al_xGa_{1-x})_{0.5}In_{0.5}P$ first upper cladding layer 4, the light-emission layer 3, and the n-type $(Al_xGa_{1-x})_{0.5}In_{0.5}P$ lower cladding layer 2 so as to reach the n-type GaAs substrate 1. In this example, the interval between the pair of trenches 14 is about 20 micrometers.

The inner surfaces of the pair of trenches 14 and the upper surface of the p-type GaAs contact layer 9 except for a portion of the upper surface of the p-type GaAs contact layer 9 between the pair of trenches 14 are covered by an insulation film 11, and a first p-side electrode 12a is formed on the portion of the upper surface of the p-type GaAs contact layer 9. In addition, a second p-side electrodes 12b is formed as a pad electrode on an area of the upper surface of the insulation film 11. In order to reduce the parasitic capacitances between the p-type GaAs contact layer 9 and the second p-side electrodes 12b through the insulation film 11, the second p-side electrodes 12b further extends to certain portions of the inner surfaces of the pair of trenches 14.

The light-emission layer 3 is constituted by $(Al_xGa_{1-x})_{0.5}In_{0.5}P$ lower and upper optical waveguide layers (x=0.5) and an InGaP tensile-strain quantum-well active layer formed between the $(Al_xGa_{1-x})_{0.5}In_{0.5}P$ lower and upper optical waveguide layers. At this time, in order to obtain sufficient gain with low operating current and reduce the variations in the laser characteristics with the production process, it is desirable that the thickness of the InGaP tensile-strain quantum-well active layer is 10 to 20 nm.

In addition, the light-emission end facet (the forward-end facet) and the opposite end facet (the back-end facet) are each coated with a reflection film (e.g., a dielectric multilayer film). The reflection films on the forward-end facet and the back-end facet are chosen so as to reduce the mirror loss.

Figure 2:
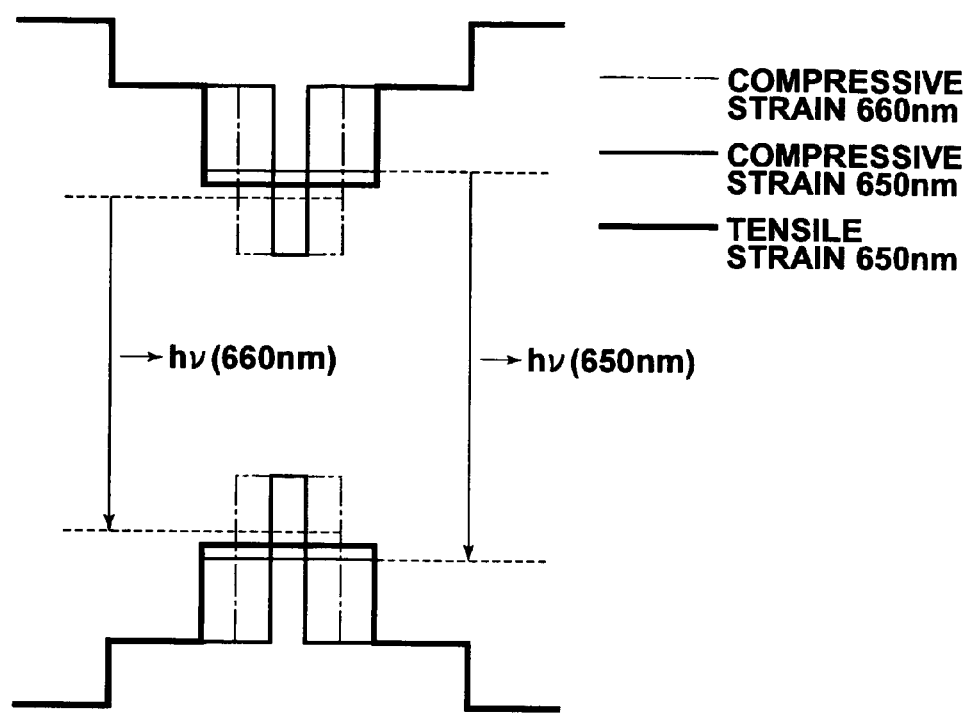
FIG. 2 is a band diagram indicating energy levels of the layers including the quantum-well active layer.

The first characteristic feature of the above semiconductor laser element is that the quantum-well active layer has a tensile strain. FIG. 2 is a band diagram indicating energy levels of the layers including the quantum-well active layer. In FIG. 2, the dash-dot lines indicate the energy levels in the case where the oscillation wavelength of 660 nm is realized with a compressed-strain quantum-well active layer, the thinner solid lines indicate the energy levels in the case where the oscillation wavelength of 650 nm is realized with a compressed-strain quantum-well active layer, and the thicker solid lines indicate the energy levels in the case where the oscillation wavelength of 650 nm is realized with a tensile-strain quantum-well active layer. As indicated in FIG. 2, the oscillation wavelength of 650 nm can be realized with either of the compressed-strain quantum-well active layer and the tensile-strain quantum-well active layer. However, in the case of the compressed-strain quantum-well active layer, the thickness of the active layer is required to be reduced as illustrated in FIG. 2. Therefore, the aforementioned problems such as the insufficient gain occur. On the other hand, it is possible to realize the oscillation wavelength of 650 nm or smaller with a tensile-strain quantum-well active layer having a thickness sufficient to avoid the above problems.

The second characteristic feature of the above semiconductor laser element is that the mirror loss is suppressed by appropriately determining the resonator length and the reflectances of the forward-end facet and the back-end facet.

The present inventor has produced a sample of the semiconductor laser element having the structure described above, and evaluated the characteristics of the sample. In the sample, the thickness of the InGaP tensile-strain quantum-well active layer is 10 nm, the degree of mismatch Δa/a of the InGaP tensile-strain quantum-well active layer with the GaAs substrate 1 is −0.3%, the reflectance of the forward-end facet is 60%, the reflectance of the back-end facet is 90%, and the resonator length is 400 micrometers.

The above evaluation result shows that the sample has satisfactory characteristics. That is, the threshold current is 40 mA, and the slope efficiency is 0.2 W/A. The optical output power necessary for the optical communications using the plastic fibers is about 1 mW. The operating current has been measured to be about 45 mA at the room temperature (25° C.) when the optical output power is 1 mW. At this time, the oscillation wavelength is measured to be about 643 nm. In addition, a reliability test has been performed at the ambient temperature of 50° C. with the optical output power of 1 mW, and the lifetime has been estimated to be about 50,000 hours. The estimated lifetime is a time at which the driving current value of the semiconductor laser element is estimated to increase by 20% over its initial value.

Figure 3:
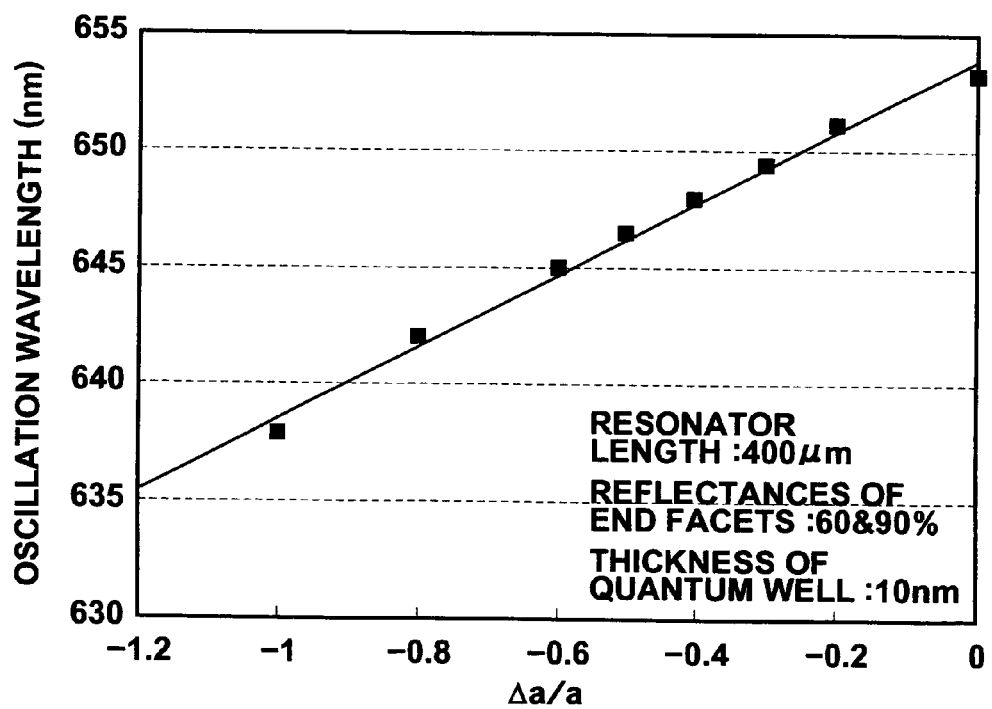
FIG. 3 is a graph indicating a relationship between the degree of mismatch and the oscillation wavelength.

In addition, the present inventor has evaluated the influence of the degree of mismatch $\Delta a/a$ of the InGaP tensile-strain quantum-well active layer on the oscillation wavelength of the semiconductor laser element. FIG. 3 is a graph indicating as a result of the evaluation a relationship between the degree of mismatch and the oscillation wavelength. In FIG. 3, the abscissa corresponds to the degree of mismatch $\Delta a/a$ of the InGaP tensile-strain quantum-well active layer, and the ordinate corresponds to the oscillation wavelength.

As indicated in the graph of FIG. 3, the oscillation wavelength is about 638, 642, 645, 646, 648, or 651 nm in the case where the degree of mismatch $\Delta a/a$ is $-1\%$, $-0.8\%$, $-0.6\%$, $-0.5\%$, $-0.4\%$, or $-0.2\%$, respectively, is slightly smaller than 650 nm in the case where the degree of mismatch $\Delta a/a$ is $-0.3\%$, and is about 653 nm in the case where the degree of mismatch $\Delta a/a$ is zero, i.e., the quantum-well active layer is unstrained.

The above evaluation result shows that when the degree of mismatch $\Delta a/a$ of the InGaP quantum-well active layer is $-0.6\%$, $-0.5\%$, $-0.4\%$, or $-0.3\%$, the oscillation wavelength of 640 to 650 nm is obtained at the ambient temperature of 25° C. with the optical output power of 1 mW.

Figure 4:
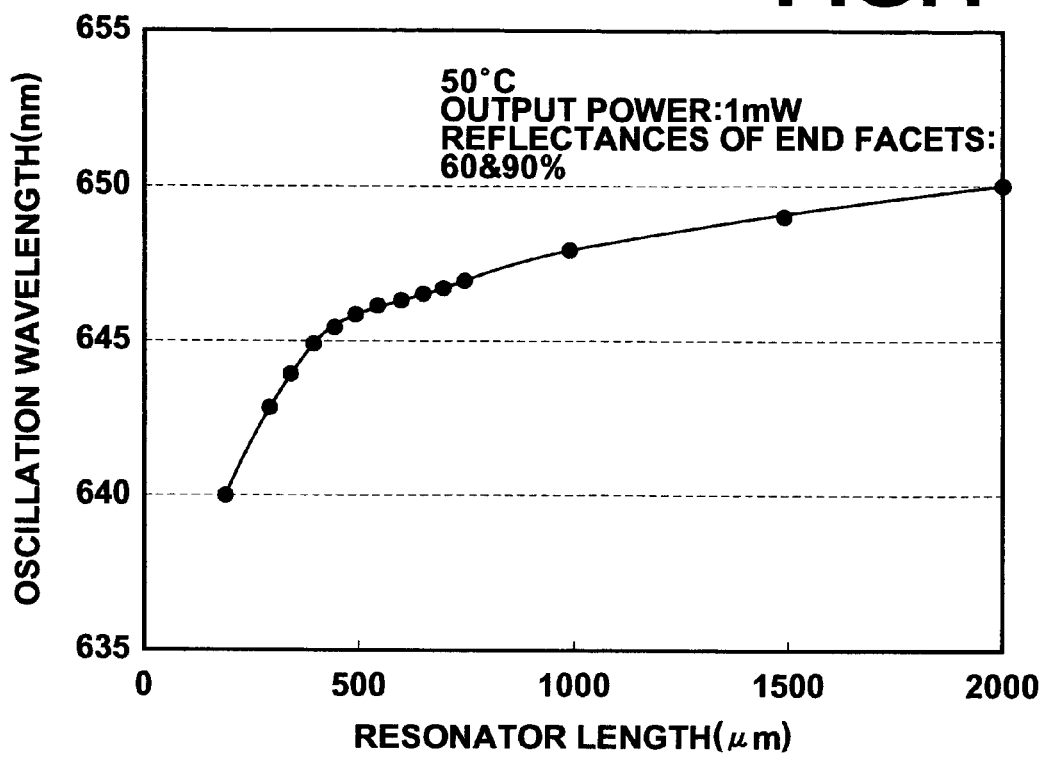
FIG. 4 is a graph indicating a relationship between the resonator length and the oscillation wavelength.

Further, the present inventor has evaluated the influence of the resonator length of the semiconductor laser element on the oscillation wavelength. The reflectances of the forward-end facet and the back-end facet of the evaluated sample are 60% and 90%, respectively, and the evaluation is performed at the ambient temperature of 50° C. with the output power of 1 mW. FIG. 4 is a graph indicating as a result of the evaluation a relationship between the resonator length and the oscillation wavelength. In FIG. 4, the abscissa corresponds to the resonator length, and the ordinate corresponds to the oscillation wavelength.

As indicated in the graph of FIG. 4, the oscillation wavelength is about 640, 643, 645, 649, or 650 nm in the case where the resonator length is about 150, 300, 400, 1,500, or 2,000 micrometers, respectively, and the oscillation wavelength is slightly smaller than 648 nm in the case where the resonator length is about 1,000 micrometers. In addition, while the oscillation wavelength rapidly varies with the resonator length when the resonator length is 400 micrometers or smaller, the oscillation wavelength relatively slowly varies with the resonator length when the resonator length is 400 micrometers or greater.

Based on the above evaluation result, it is confirmed that the oscillation wavelength of 645 to 650 nm is obtained at the ambient temperature of 25° C. with the output power of 1 mW when the resonator length is 400 micrometers or greater.

Figure 5:
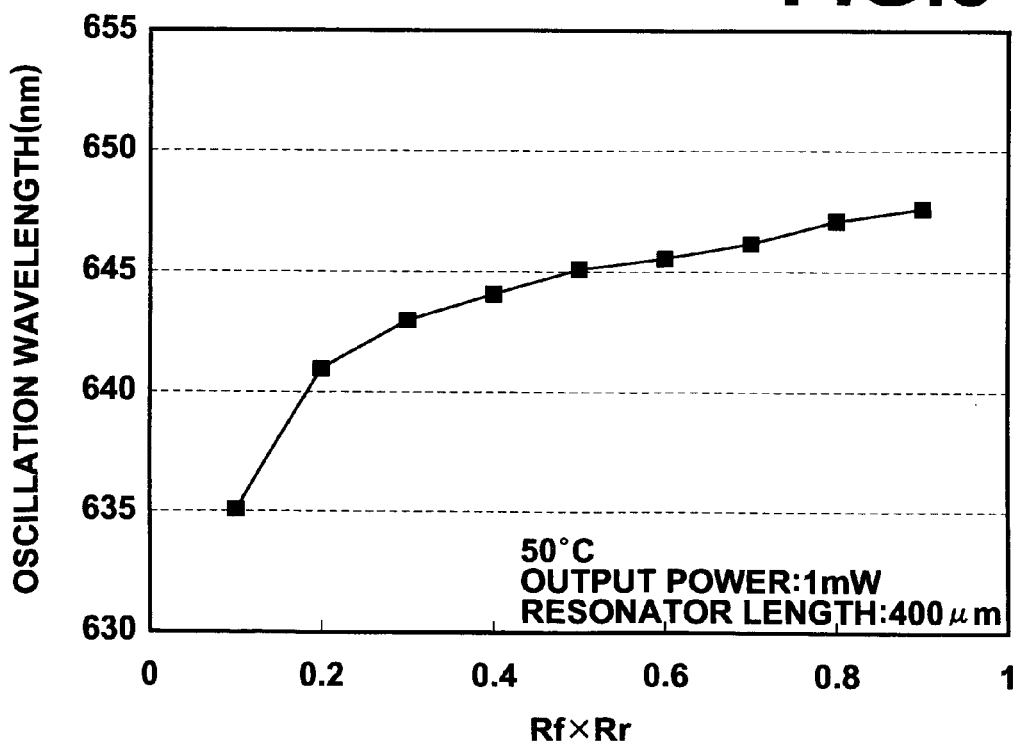
FIG. 5 is a graph indicating a relationship between the reflectances of end facets and the oscillation wavelength.

Furthermore, the present inventor has evaluated the influence of the reflectances of the forward-end facet and the back-end facet of the semiconductor laser element on the oscillation wavelength. The resonator length of the evaluated sample is 400 micrometers, and the evaluation is performed at the ambient temperature of 50° C. with the output power of 1 mW. FIG. 5 is a graph indicating as a result of the evaluation a relationship between the reflectances of the end facets and the oscillation wavelength. In FIG. 5, the ordinate corresponds to the oscillation wavelength, and the abscissa corresponds to the product $Rf \times Rr$ of the reflectances of the forward-end facet and the back-end facet.

As indicated in the graph of FIG. 5, the oscillation wavelength is about 635 or 641 nm when the product $Rf \times Rr$ of the reflectances is 0.1 or 0.2, respectively. The oscillation wavelength of the semiconductor laser element increases with the product $Rf \times Rr$ of the reflectances, and the oscillation wavelength is about 645 or 647 nm when the product $Rf \times Rr$ of the reflectances is 0.5 or 0.9, respectively.

Based on the above evaluation result, it is confirmed that the oscillation wavelength of 645 to 650 nm is obtained at the ambient temperature of 25° C. with the output power of 1 mW when the the product $Rf \times Rr$ of the reflectances of the forward-end facet and the back-end facet is 0.5 or greater.

As explained above, when the InGaP quantum-well active layer has a thickness of 10 to 20 nm and a degree of mismatch of $-0.6\%$ to $-0.3\%$ with the GaAs substrate, and the resonator length of the semiconductor laser element is 400 micrometers or greater, and the product $Rf \times Rr$ of the reflectances of the forward-end facet and the back-end facet is 0.5 or greater, the short oscillation wavelength of 645 to 650 nm can be obtained at the room temperature (about 25° C.) without impairing the current-optical output characteristic and the lifetime of the semiconductor laser element.

The following variations are also included in the scope of the present invention.

(i) Although, in the GaAs substrate used in the described embodiment, the crystal orientation of the principal plane is tilted 15 degrees from (100) toward (011), it has been confirmed that a similar evaluation result can be obtained even when the tilt angle of the crystal orientation of the principal plane of the GaAs substrate from (100) toward (011) is 5, 7, 9, 11, 13, 15, or 20 degrees.

(ii) Although, according to the described embodiment, the aluminum composition x in the $(Al_xGa_{1-x})_{0.5}In_{0.5}P$ optical waveguide layers is 0.5, it has been confirmed that the oscillation wavelength of 645 to 650 nm can be realized at the temperature of 25° C. by finely controlling the thickness of the quantum-well active layer within the range of 10 to 20 nm, even when the composition x is 0.4, 0.45, 0.55, or 0.6.

(iii) Although, according to the described embodiment, the buried-ridge structure in which the ridge is sandwiched by the n-type GaAs current-blocking layer 10, the transverse modes may be controlled in any other manners. That is, the semiconductor laser elements according to the present invention may be formed of any other materials with any other structures. For example, the current-blocking layer 10 in the laser structure according to the described embodiment may be made of n-type AlInP instead of n-type GaAs, or the semiconductor laser element according to the present invention may be formed with a laser structure other than the ridge structure.

(iv) It is possible to invert the conductivity types of all of the layers in the structure of the embodiment. Even when the conductivity types are inverted, the present invention is similarly effective. Therefore, semiconductor laser elements having the inverted conductivity types are also included within the scope of the present invention.

Since the oscillation wavelengths of the semiconductor laser elements according to the described embodiment and the above-mentioned variations are 645 to 650 nm, even when the plastic fibers are used as a light transmission medium, it is possible to suppress the internal loss, and increase the transmission distance. Thus, the semiconductor laser elements according to the described embodiment and the above-mentioned variations can reduce the cost of placement of fibers, and greatly contribute to the development of the optical communication systems.

In addition, all of the contents of the Japanese patent application No. 2004-063879 are incorporated into this specification by reference.

What is claimed is:

1. A semiconductor laser element comprising:
   a substrate made of GaAs of a first conductive type;
   a lower cladding layer formed above said substrate and made of AlGaInP of said first conductive type;
   a lower optical waveguide layer formed above said lower cladding layer and made of AlGaInP;
   a quantum-well active layer formed above said lower optical waveguide layer and made of InGaP;
   an upper optical waveguide layer formed above said quantum-well active layer and made of AlGaInP; and
   an upper cladding layer formed above said upper optical waveguide layer and made of AlGaInP of a second conductive type;
   wherein said substrate has an intrinsic lattice constant a, and said quantum-well active layer has a thickness dw, an intrinsic lattice constant a+Δa, and a degree of mismatch Δa/a with said substrate, and the thickness dw and the degree of mismatch satisfy conditions, $-0.6\% \leq \Delta a/a \leq -0.3\%$, and $10 \text{ nm} \leq dw \leq 20 \text{ nm}$; and said semiconductor laser element has a resonator length Lc, a light-emission end facet exhibiting a first reflectance Rf, and an end facet being located opposite to the light-emission end facet and exhibiting a second reflectance Rr, and the resonator length Lc and the first and second reflectances Rf and Rr satisfy conditions, $Lc \geq 400 \text{ μm}$, and $Rf \times Rr \geq 0.5$.

2. A semiconductor laser element according to claim 1, wherein said thickness dw, said degree of mismatch Δa/a, said resonator length Lc, and said first and second reflectances Rf and Rr are determined so that an oscillation wavelength of the semiconductor laser element is 645 to 650 nm at an ambient temperature of 25° C. when optical output power of the semiconductor laser element is 1 mW.

* * * * *